US007563103B1

(12) United States Patent
Hall et al.

(10) Patent No.: US 7,563,103 B1
(45) Date of Patent: Jul. 21, 2009

(54) CONNECTOR ASSEMBLY HAVING A BENT IN PLACE CONTACT

(75) Inventors: John Wesley Hall, Harrisburg, PA (US); Douglas John Hardy, Middletown, PA (US); John Mark Myer, Millersville, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/121,648

(22) Filed: May 15, 2008

(51) Int. Cl.
*H01R 12/00* (2006.01)
*H05K 1/00* (2006.01)

(52) U.S. Cl. .......................... 439/63; 439/581; 439/902

(58) Field of Classification Search ................... 439/63, 439/581, 582, 902
See application file for complete search history.

(56) References Cited

U.S. PATENT DOCUMENTS 4,623,211 A * 11/1986 Dambach et al. ............ 439/607
4,666,231 A * 5/1987 Sheesley et al. ............. 439/581
4,846,711 A * 7/1989 Kobler et al. ................. 439/63
6,824,403 B2 11/2004 Hall et al.
7,029,286 B2 4/2006 Hall et al.
7,150,648 B1 * 12/2006 Hall et al. ................... 439/581
7,267,570 B2 9/2007 Fry, Jr. et al.
7,273,394 B1 * 9/2007 English ...................... 439/582
7,285,011 B2 10/2007 Hardy et al.
7,326,063 B1 2/2008 Raudenbush et al.
7,347,742 B2 3/2008 Hall et al.

OTHER PUBLICATIONS

Amphenol RF, Global RF Solutions, Product Catalog, Series: FAKRA SMB, Gender: Jack, Connector Body Style: Right Angle, Results: 1-12, downloaded from website http://www.amphenolrf.com/search.asp?sid+482B7D0016E1617F &N=33+4294967270+4294967. . . , May 15, 2008, (2) pages.

Amphenol RF, Global RF Solutions, Product Catalog, Series: FAKRA SMB, Product Type: Connectors-Printed Circuit Board, Connector Body Style: Right, RoHS Compliant, (49) Results, downloaded from website: http://www.amphenolrf.com/search.asp?sid=482B7D0016E1617F&N=33+76+4294967232, May 15, 2008, (6) pgs.

* cited by examiner

*Primary Examiner*—Hae Moon Hyeon

(57) ABSTRACT

A connector assembly includes a shell having a mating interface and a cavity. A dielectric body is received in the cavity and includes a contact channel extending from a front end of the dielectric body to a rear end of the dielectric body. The dielectric body has a contact slot open along a rear portion of the contact channel, wherein an anvil section is defined at a forward intersection of the contact channel and the contact slot. A contact is received in the dielectric body and includes a mating end extending along a mating centerline and a mounting end extending along a mounting centerline that is transverse to the mating centerline. The contact has a transition section bent at a transition angle, wherein the contact is bent about the anvil section to the transition angle.

20 Claims, 8 Drawing Sheets

CONNECTOR ASSEMBLY HAVING A BENT IN PLACE CONTACT

BACKGROUND OF THE INVENTION

The subject matter herein relates generally to connector assemblies, and more particularly to connector assemblies having a bent in place contact.

Radio frequency (RF) connector assemblies have been used for numerous automotive applications, such as global positioning systems (GPS), car radios, mobile phones, air bag systems, and multimedia devices. The connector assemblies are typically coaxial cable connectors that are provided at the end of coaxial cables. However, at least some known RF connector assemblies are directly mounted to circuit boards.

In order to standardize various types of connector assemblies, particularly the interfaces for such connector assemblies, certain industry standards have been established. One of these standards is referred to as FAKRA. FAKRA is the Automotive Standards Committee in the German Institute for Standardization, representing international standardization interests in the automotive field. The FAKRA standard provides a system, based on keying and color coding, for proper connector attachment. Like jack keys can only be connected to like plug keyways in FAKRA connectors. Secure positioning and locking of connector housings is facilitated by way of a FAKRA defined catch on the jack housing and a cooperating latch on the plug housing.

Plug connectors, such as those used within the FAKRA standard, typically include a shell and/or outer housing, a dielectric and a center contact. The center contact may define a socket at the mating end for mating with the corresponding jack connector. In conventional plug connectors, the various components thereof, such as the shell, dielectric and/or the center contact, can be machine screwed. However, such processes may be time consuming and/or expensive.

BRIEF DESCRIPTION OF THE INVENTION

In one embodiment, a connector assembly is provided including a shell having a mating interface and a cavity. A dielectric body is received in the cavity and includes a contact channel extending from a front end of the dielectric body to a rear end of the dielectric body. The dielectric body has a contact slot open along a rear portion of the contact channel. The dielectric body has an anvil portion at a forward intersection of the contact channel and the contact slot. A contact is received in the dielectric body and includes a mating end and a mounting end separated from one another by a transition section with the mounting end being received through the contact channel until the transition section is located proximate to the anvil section. The transition section is bent about the anvil section of the dielectric body to a transition angle such that the mounting end is oriented transverse to the mating end.

Optionally, the contact may be initially received in the dielectric body such that the mating end and the mounting end are generally parallel and aligned with one another. The contact may be bent about the anvil section by moving the mounting end in a transitioning direction. The transition angle may be approximately ninety degrees such that the contact defines a right angle contact. Optionally, the dielectric body may include a detent portion extending into the slot, wherein the detent portion holds the contact. The dielectric body may include a positioning surface extending into at least one of the slot and the channel, the contact engages, and is positioned by, the positioning surface. Optionally, the dielectric body may include a front dielectric portion and a rear dielectric portion separately received in the cavity, with the front dielectric portion initially loaded into the cavity, the mating end of the contact then loaded into the front dielectric portion, and the rear dielectric portion then loaded onto the mounting end of the contact to a final position. The transition section of the contact may be bent about the anvil after the rear dielectric portion is in the final position.

In another embodiment, a connector assembly is provided that includes a circuit board defining an RF antenna and a plug connector electrically and mechanically coupled to the circuit board, wherein the plug connector is matable with a FAKRA jack. The plug connector includes a shell having a mating interface and a cavity, a dielectric body received in the cavity and having an anvil section therein, and a contact received in the dielectric body. The contact has a mating end for mating with the FAKRA jack and a mounting end coupled to the circuit board, wherein the contact is bent in place on the anvil section to form a right angle contact. Optionally, the contact may be generally straight when initially received in the dielectric body, and then the contact may be bent about the anvil section such that the mounting end is oriented approximately perpendicular to the mating end.

In a further embodiment, a connector assembly is provided including a shell having a mating interface and a cavity and a dielectric body received in the cavity. The dielectric body has a contact channel extending from a front end of the dielectric body to a rear end of the dielectric body and a base generally opposite to the contact channel. The dielectric body has a contact slot extending between the contact channel and the base. An anvil portion is defined at a forward intersection of the contact channel and the contact slot. The dielectric body defines a C-shaped clip within the slot. A contact is received in the dielectric body and the contact has a mating end and a mounting end, wherein the contact is bent about the anvil section until the contact is received within the clip in a snap-fit manner.

DETAILED DESCRIPTION OF THE INVENTION

Figure 1:
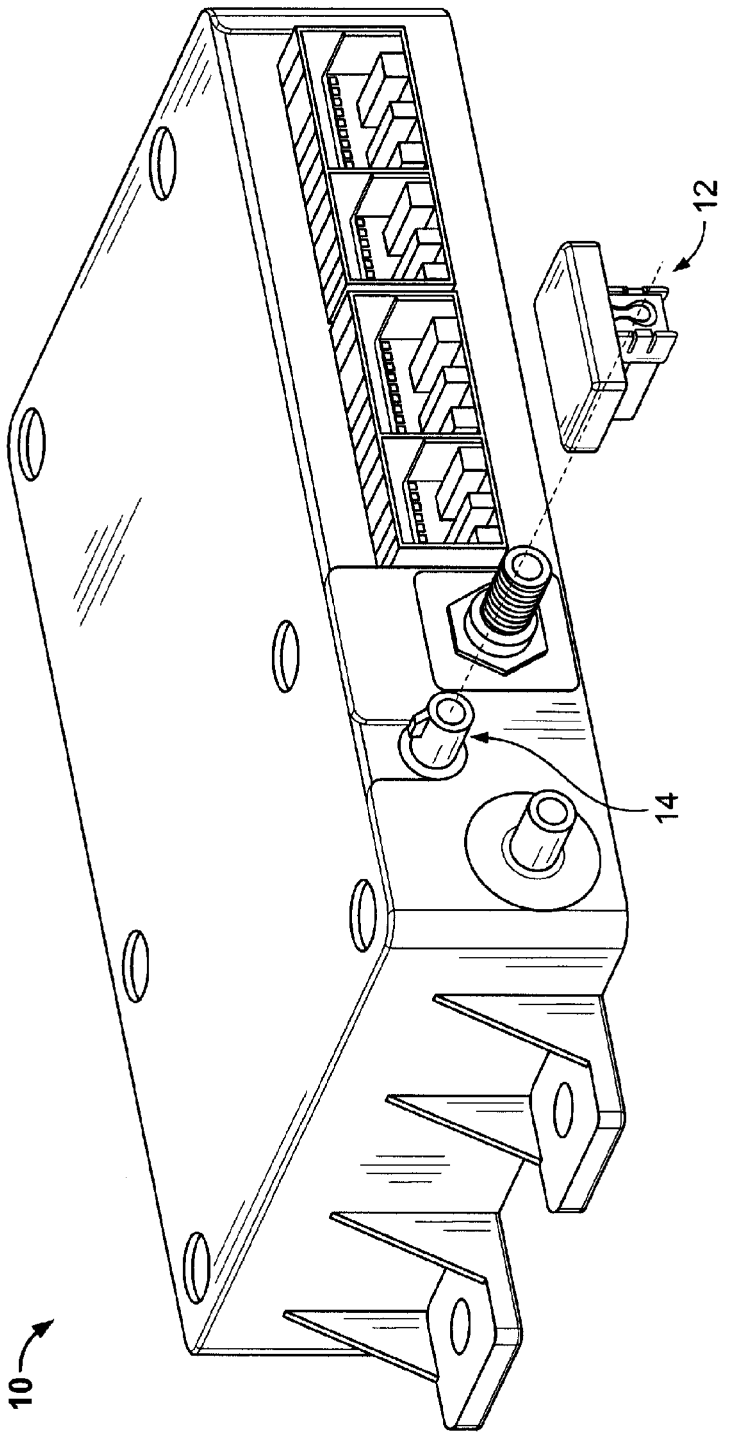
FIG. 1 illustrates a system utilizing a connector assembly formed in accordance with an exemplary embodiment.

FIG. 1 illustrates a system 10 utilizing a connector assembly 12 formed in accordance with an exemplary embodiment. In the illustrated embodiment, the system 10 is a communications system, such as for an automotive vehicle, and the connector assembly 12 is an RF plug connector, such as an RF antenna. While FIG. 1 illustrates the system 10 as a communication system and the connector assembly 12 as an RF antenna, the subject matter herein is not limited to such systems and components. The system 10 and connector assembly 12 are merely illustrative and are not limited to the embodiments illustrated herein.

The connector assembly 12 is coupled to a mating connector 14. The connector assembly 12 is supported by the mating connector 14 when mated thereto. In an exemplary embodiment, the mating connector 14 defines a FAKRA jack and the connector assembly 12 defines a FAKRA plug. While FIG. 1 illustrates the mating connector 14 as a FAKRA jack and the connector assembly 12 as a FAKRA plug, the subject matter herein is not limited to connectors meeting the FAKRA standard. The plug and jack are merely illustrative and are not limited to the embodiments illustrated herein.

Figure 2:
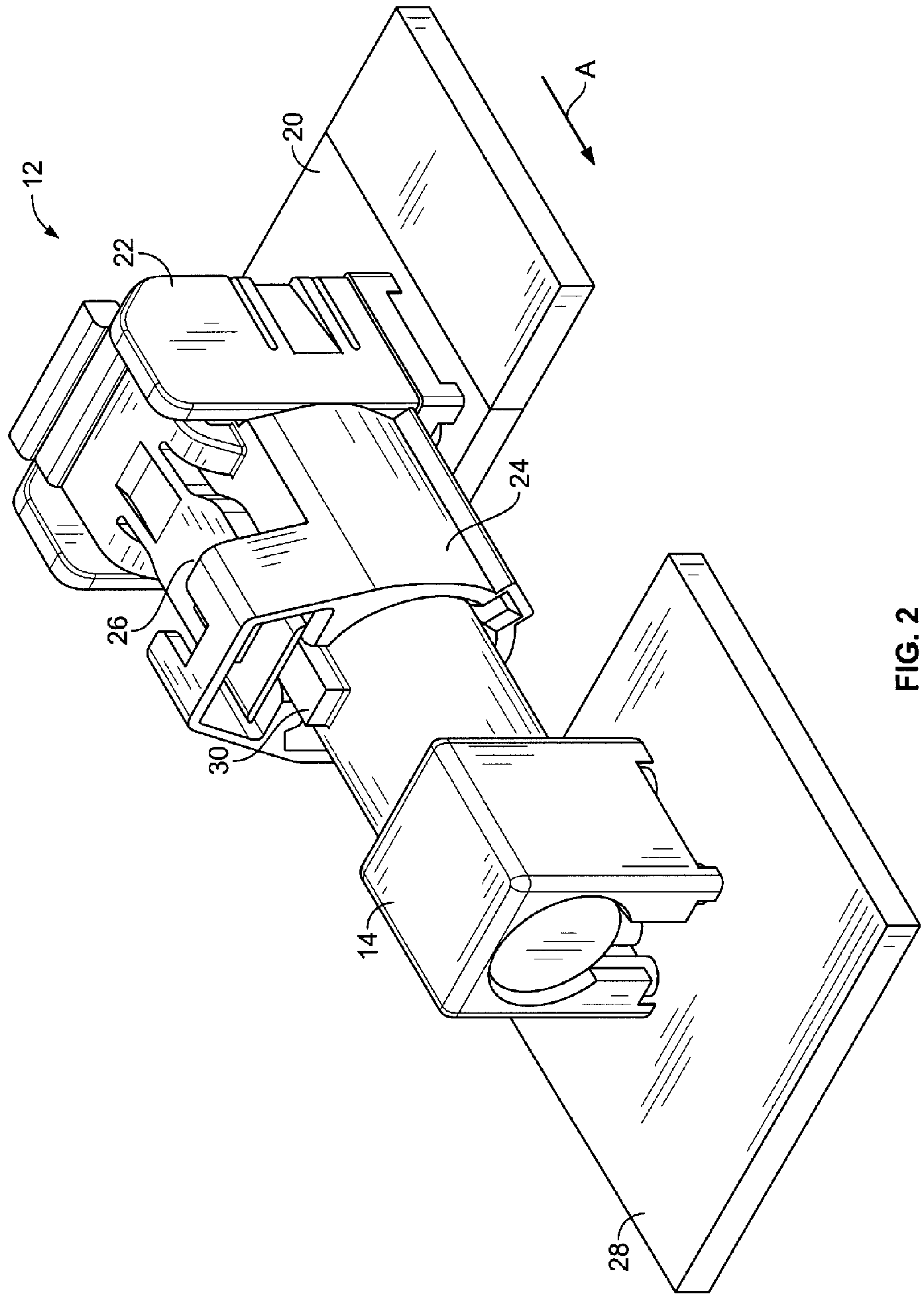
FIG. 2 illustrates the connector assembly shown in FIG. 1 mated with a mating connector.

FIG. 2 illustrates the connector assembly 12 partially mated with the mating connector 14. The connector assembly 12 includes a circuit board 20 and a plug connector 22 electrically and mechanically coupled to the circuit board 20. In an exemplary embodiment, the connector assembly 12 includes an outer housing 24 having a latch assembly 26 for latching engagement with the mating connector 14.

In the illustrated embodiment, the mating connector 14 is electrically and mechanically coupled to a circuit board 28. The mating connector 14 includes a catch 30 for mating engagement with the latch assembly 26 of the connector assembly 12. During mating, the connector assembly 12 is mated with the mating connector 14 in a mating direction, shown in FIG. 2 by an arrow A. When fully mated, a circuit is formed that includes the circuit board 20, the plug connector 22, the mating connector 14 and the circuit board 28. The system 10 (shown in FIG. 1) thus includes a board-to-board connection via the connector assembly 12 and the mating connector 14. In alternative embodiments, at least one of the plug connector 22 and the mating connector 14 may be cable connectors mounted to an end of a coaxial cable.

Figure 3:
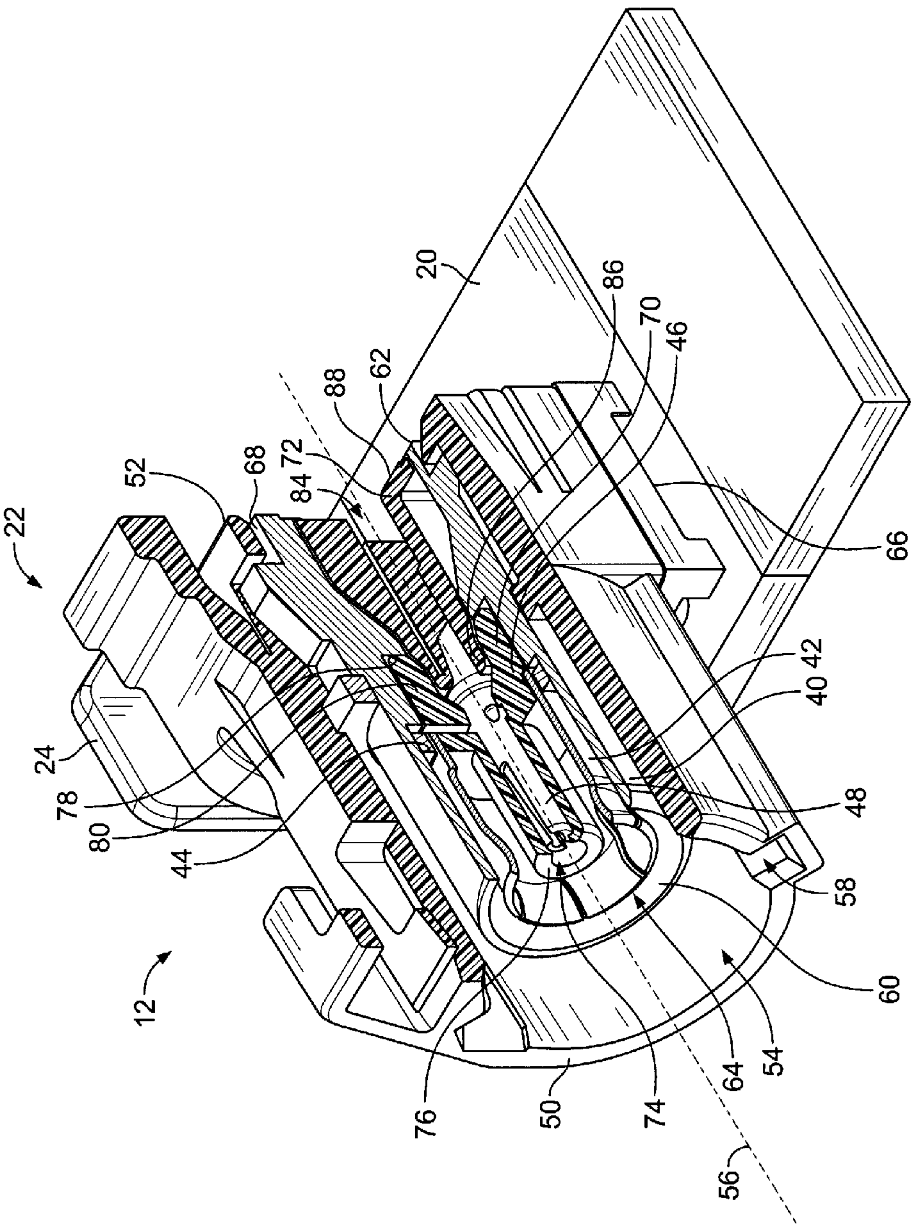
FIG. 3 is a partial cutaway view of the connector assembly shown in FIG. 1.

FIG. 3 is a partial cutaway view of the connector assembly 12. In an exemplary embodiment, the plug connector 22 includes the outer housing 24, a shell 40, an outer contact 42, a retaining ring 44, a dielectric body 46, and a center contact 48.

The outer housing 24 defines an outer envelope of the connector assembly 12. The outer housing 24 may be fabricated from a non-conductive material, such as a plastic material. The outer housing 24 includes a housing mating end 50 at a front of the outer housing 24 and a housing rear end 52 generally opposite to the housing mating end 50. The outer housing 24 includes a housing cavity 54 extending along a contact axis 56. Optionally, the contact axis 56 may define a central axis of the housing cavity 54. The outer housing 24 includes at least one keyway 58 open at the mating end 50 for keyed or polarizing mating with the mating connector 14 (shown in FIG. 1). Features of the outer housing 24 may be sized, shaped and positioned to comply with standards, such as the FAKRA standard. For example, the housing cavity 54 and the keyway 58 may define a mating interface at the mating end 50 that have certain dimensions and locations.

The shell 40 is positioned within the housing cavity 54. The shell 40 may be fabricated from a conductive material, such as a metal material. Optionally, the shell 40 may be die-cast. Alternatively, the shell 40 may be formed by other known processed, such as screw machining. The shell 40 includes a shell mating end 60 at a front of the shell 40 and a shell rear end 62 generally opposite to the shell mating end 60. The shell 40 includes a shell cavity 64 extending along the contact axis 56. Optionally, the contact axis 56 may define a central axis of the shell cavity 64. In an exemplary embodiment, both the mating end 60 and the rear end 62 of the shell 40 are at least partially open to provide access to the shell cavity 64. The shell 40 includes a base 66 opposite a top 68 of the shell 40. The base 66 is positioned proximate the circuit board 20. In an exemplary embodiment, the base 66 of the shell 40 is mounted directly to the circuit board 20.

The outer contact 42 is received within the shell cavity 64. In an exemplary embodiment, the retaining ring 44 is used to hold the outer contact 42 within the shell cavity 64. The retaining ring 44 is positioned between the outer contact 42 and the shell 40. The outer contact 42 is configured to engage a portion of the mating connector 14, such as a shell or a contact of the mating connector 14. Optionally, the outer contact 42 may define a ground of the connector assembly 12. The outer contact 42 may be centered about the contact axis 56.

The dielectric body 46 is positioned within the shell cavity 64. In an exemplary embodiment, the dielectric body 46 is fabricated from separate dielectric elements, such as a front dielectric portion 70 and a rear dielectric portion 72. The front and rear dielectric portions 70, 72 cooperate to hold the center contact 48. The front and rear dielectric portions 70, 72 cooperate to electrically isolate the center contact 48 from other components, such as the shell 40 and/or the outer contact 42. In an exemplary embodiment, sections of the front and rear dielectric portions 70, 72 may have sizes and shapes that are complimentary to the shell cavity 64 such that the front and rear dielectric portions 70, 72 fit within the shell cavity 64 and/or engage the shell cavity 64. Optionally, the fit may be a friction fit to hold the front and rear dielectric portions 70, 72 within the shell cavity 64. Alternatively, retaining features on the front and rear dielectric portions 70, 72 and/or on the shell cavity 64 may be used to hold the front and rear dielectric portions 70, 72 within the shell cavity 64. In some alternative embodiments, the connector assembly 12 may include more or less than two dielectric portions.

The front dielectric portion 70 includes a contact channel 74 extending between a front end 76 and a rear end 78. An outer surface 80 of the front dielectric portion 70 is generally cylindrical along the contact axis 56. Optionally, the outer surface 80 may be stepped such that different sections of the front dielectric portion 70 have different diameters. The contact channel 74 is open at the front end 76 to receive a mating contact of the mating connector 14. The contact channel 74 is sized to receive the center contact 48. The contact channel 74 extends along the contact axis 56. In an exemplary embodiment, at least a portion of the rear dielectric portion 72 may be received in the contact channel 74 of the front dielectric portion 70. Optionally, the size (e.g. diameter) of the contact channel 74 may be increased at the rear end 78 to accommodate the rear dielectric portion 72.

The rear dielectric portion 72 includes a contact channel 84 extending between a front end 86 and a rear end 88. The contact channel 84 is open at the front end 86 and the rear end 88. The contact channel 84 is sized to receive the center contact 48. The contact channel 84 extends along the contact axis 56.

The center contact 48 is received in the dielectric body 46. In an exemplary embodiment, the center contact 48 is received in the contact channels 74, 84 of both the front and rear dielectric portions 70, 72. At least a portion of the center contact 48 extends along the contact axis 56.

Figure 4:
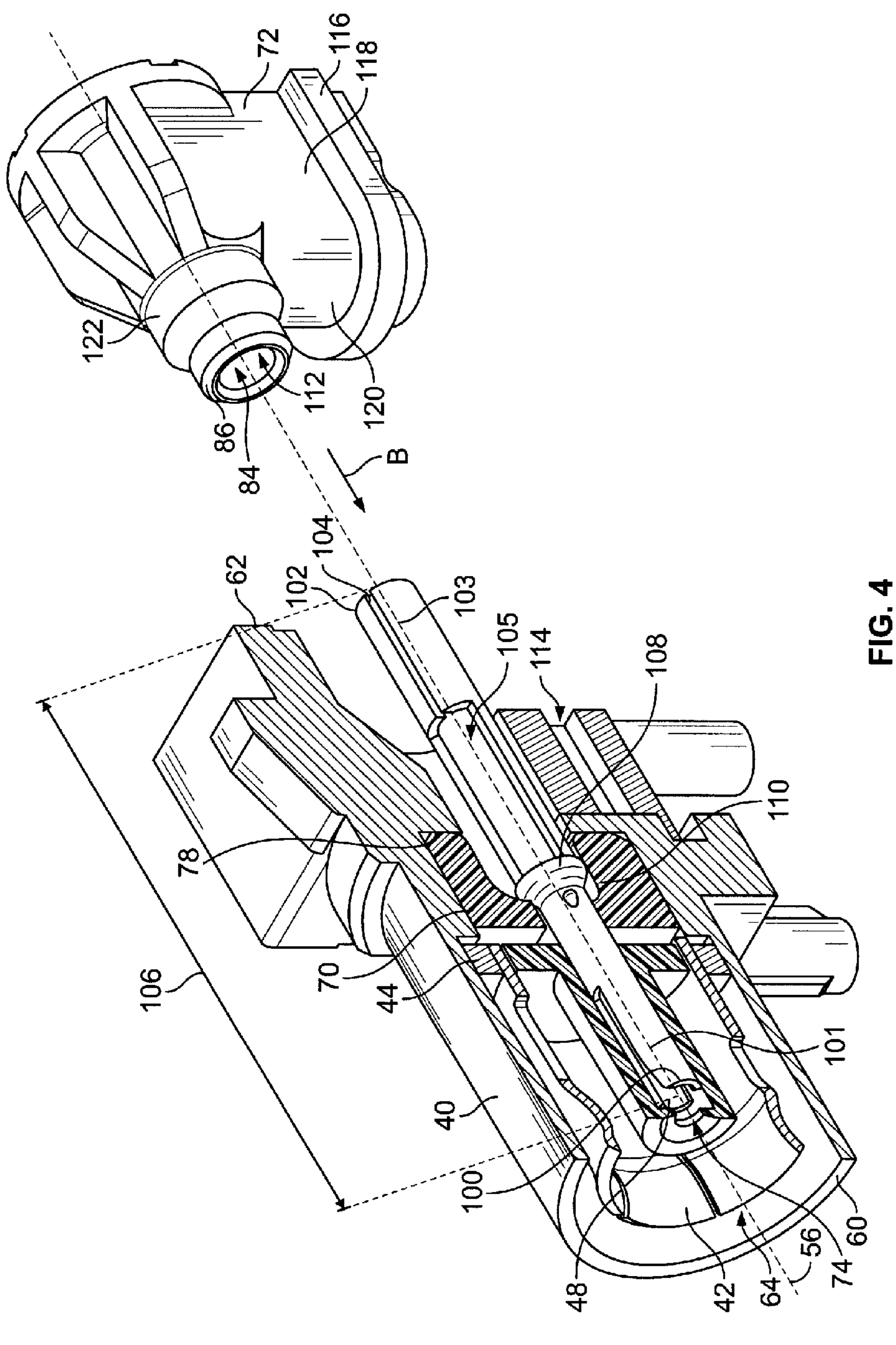
FIG. 4 is a partial cross-sectional view of a portion of the connector assembly shown in FIG. 1.

FIG. 4 is a partial cross-sectional view of a portion of the connector assembly 12 (shown in FIG. 1) with the outer housing (shown in FIG. 2) removed and illustrated during an intermediate stage of assembly. In an early stage of assembly, the front dielectric portion 70, the outer contact 42 and the retaining ring 44 are loaded into the shell cavity 64. In an exemplary embodiment, the front dielectric portion 70, the outer contact 42 and the retaining ring 44 are loaded into the shell cavity 64 through the mating end 60. In an intermediate stage of assembly, the center contact 48 is loaded into the contact channel 74 of the front dielectric 70, such as in the direction of arrow B. For example, the center contact 48 may be loaded into the contact channel 74 through the rear end 78. Optionally, the center contact 48 may be loaded into the contact channel 74 prior to loading the front dielectric portion 70 into the shell cavity 64.

The center contact 48 includes a mating end 100 and a mounting end 102. The mating end 100 extends along a mating centerline 101 and the mounting end 102 extends along a mounting centerline 103. The center contact 48 includes a transition section 105 extending at least partially between the mating end 100 and the mounting end 102. In an exemplary embodiment, the mating end 100 defines a socket configured to receive a pin contact of the mating connector 14 (shown in FIG. 1). The mating end 100 may define another type of mating interface in alternative embodiments. In an exemplary embodiment, the mounting end 102 defines a hollow C-shaped tube having tube walls 104 spaced apart from one another. The tube walls 104 may be compressed toward one another to decrease the diameter of the tube, such as to fit within a hole in the circuit board 20 (shown in FIG. 2). The tube may be resilient such that the tube walls may spread apart, such as back to the position shown in FIG. 4, when the tube walls are released. The tube may thus provide a friction fit against the walls defining the hole of the circuit board 20. The transition section 105 generally extends between the socket and the tube.

In an exemplary embodiment, the center contact 48 is fabricated from a conductive material, such as a metal material. The center contact 48 may be stamped from a blank or sheet of metal stock and then formed into the shape shown in FIG. 4, or other shapes in alternative embodiments. For example, the blank may be rolled or formed into a socket at the mating end 100 and may be rolled or formed into a C-shaped tube at the mounting end 102. The blank may also be rolled or formed into a semi-cylindrical shape at the transition section 105. As such, and by way of example only, the center contact 48 may be rolled approximately 360 degrees at the mating end 100, approximately 340 degrees at the mounting end 102, and approximately 180 degrees along the transition section 105. By stamping and forming the center contact 48, the center contact 48 may be fabricated in a cost effective and reliable manner. Other means or processes may be used to fabricate the center contact 48, such as screw machining, die casting, plated plastic, and the like.

When assembled, the center contact 48 is generally tubular and generally extends axially along the contact axis 56 for an axial length 106. The center contact 48 may be substantially straight. The mating centerline 101 and the mounting centerline 103 may be aligned with one another, such as along the contact axis 56. When loaded into the front dielectric portion 70, the center contact 48 extends rearward from the rear end 78 of the front dielectric portion 70.

In an exemplary embodiment, the center contact 48 includes a radial bead 108 that extends radially outward. The bead 108 may be formed during the forming process. Optionally, the bead 108 may be approximately centrally located along the axial length 106. The center contact 48 is rear loaded into the front dielectric portion 70 until the bead 108 engages a shoulder 110 defined in the contact channel 74 of the front dielectric portion 70. The shoulder 110 may define a stop for loading the center contact 48 into the contact channel 74. The socket at the mating end 100 has a predetermined length such that the tip of the socket is properly positioned for mating engagement with the mating contact of the mating connector 14 when the bead engages the shoulder 110. As such, the bead 108 and the shoulder 110 define the mating depth of the center contact 48.

Once positioned, the rear dielectric portion 72 is loaded into the shell cavity 64 through the shell rear end 62, such as in the direction of arrow B. During loading, the rear dielectric portion 72 is loaded over the mounting end 102 of the center contact 48. The center contact 48 is loaded into the contact channel 84 of the rear dielectric portion 72, such as through an opening 112 defined at the front end 86. The rear dielectric portion 72 is loaded into the shell cavity 64 until the front end 86 of the rear dielectric portion 72 engages the front dielectric portion 70. Alternatively, or in addition to, the rear dielectric portion 72 may be loaded into the shell cavity 64 until the rear dielectric portion 72 engages a portion of the shell 40.

In an exemplary embodiment, the shell 40 includes a slot 114 and the rear dielectric portion 72 includes a flange 116 extending outward from side walls 118 and/or a front wall 120 of the rear dielectric portion 72. The flange 116 fits into the slot 114 to align and/or hold the rear dielectric portion 72 within the shell cavity 64. In an exemplary embodiment, the side walls 118 and the front wall 120 define a U-shaped body, however other shapes are possible in alternative embodiments. In the illustrated embodiment, the rear dielectric portion 72 includes a nose 122 at the front end 86 extending forward from the front wall 120. Optionally, the nose 122 may fit at least partially within the contact channel 74 of the front dielectric portion 70 when the connector assembly 12 is assembled. In an exemplary embodiment, and as illustrated in FIG. 3, the nose 122 may abut the bead 108 when assembled. As such, the center contact 48 is captured or sandwiched between the front and rear dielectric portions 70, 72, which may limit movement of the center contact 48 once assembled.

Figure 5:
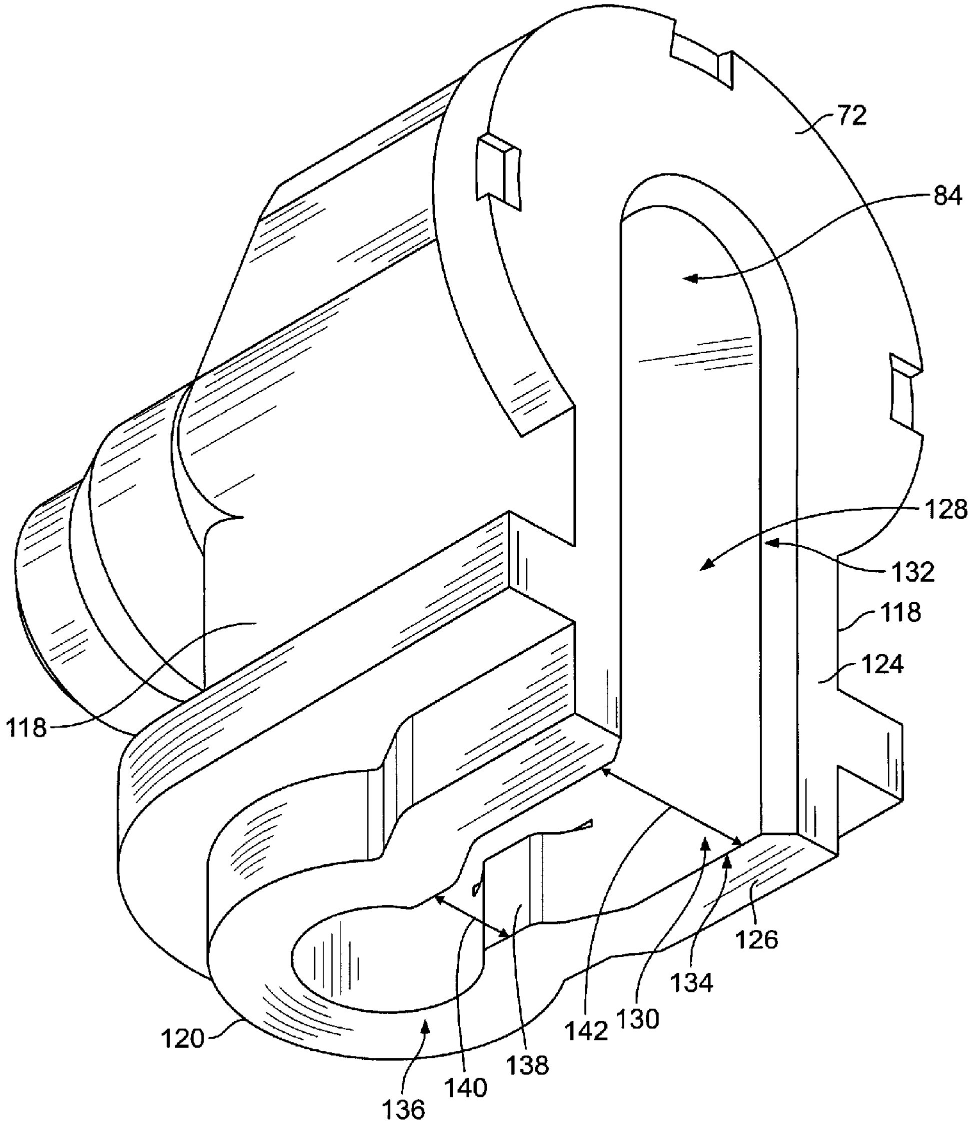
FIG. 5 is a bottom, rear perspective view of a portion of the connector assembly shown in FIG. 1.

FIG. 5 is a bottom, rear perspective view of the rear dielectric portion 72. The rear dielectric portion 72 includes the front wall 120 and the side walls 118, as well as a back wall 124 and a base 126. The rear dielectric portion 72 defines a chamber 128 therein. The contact channel 84 and a contact slot 130 together represent the chamber 128. The contact slot 130 opens to the contact channel 84. The chamber 128 is defined by the side walls 118 and the front wall 120. The back wall 124 includes an opening 132 that opens to the chamber 128. The base 126 includes an opening 134 that opens to the chamber 128. The center contact 48 (shown in FIGS. 3, 4 and 6) is configured to extend through at least one of the openings 132, 134.

In an exemplary embodiment, the contact slot 130 of the rear dielectric portion 72 includes a clip 136 that receives the center contact 48 as described in further detail below. The clip 136 may be generally C-shaped. The clip 136 may extend more than 180 degrees around. In an exemplary embodiment, the clip 136 is positioned proximate the front wall 120. Optionally, the clip 136 may be defined by the inner surface of the front wall 120 and the inner surfaces of the opposed side walls 118. The clip 136 may be positioned proximate the base 126. In an exemplary embodiment, the rearward surfaces of the clip 136 are defined by detent portions 138 that extend inwardly into the contact slot 130. The detent portions 138 may extend inward from the opposed side walls 118. The detent portions 138 are separated by a distance 140 that is less than a distance 142 separating the inner surfaces of the side walls 118 defining the contact slot 130. The distance 140 may be less than a diameter of the center contact 48 such that, when the center contact 48 is loaded into the clip 136, the detent portions 138 retain the center contact 48 therein.

Figure 6:
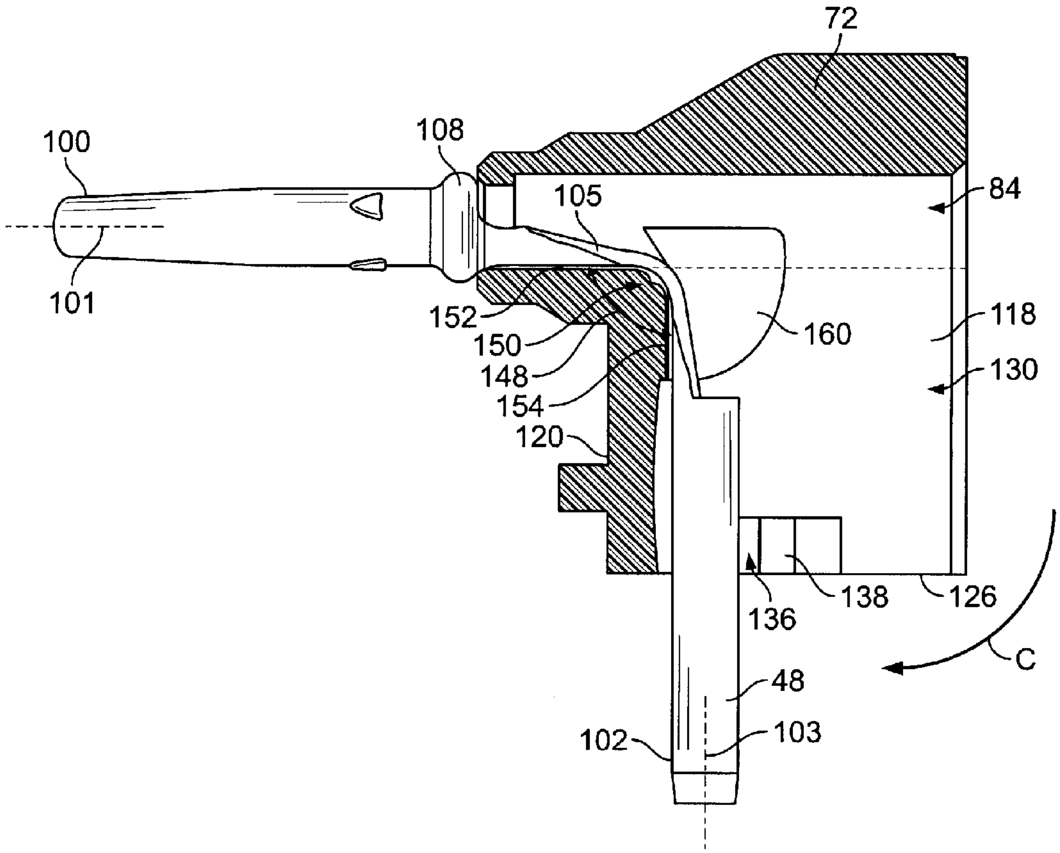
FIG. 6 is a partial cross-sectional view of another portion of the connector assembly shown in FIG. 1.

FIG. 6 is a partial cross-sectional view of another portion of the connector assembly 12 (shown in FIG. 1), illustrating the rear dielectric portion 72 and the center contact 48. In the illustrated embodiment, the socket defined at the mating end 100 and the bead 108 are located forward of the rear dielectric portion 72 and the remainder of the center contact 48 is located within or below the rear dielectric portion 72. FIG. 6 illustrates the center contact 48 in a bent position, in which the center contact 48 is bent to a non-straight position. In an exemplary embodiment, the transition section 105 of the center contact 48 is bent in place on the rear dielectric portion 72 to a transition angle 148. By being bent in place, the center contact 48 is bent after being received in the dielectric body 46. The bending of the center contact 48 is a different assembly step than forming the center contact 48 and is performed after the center contact 48 is formed into a shape and at least partially assembled within the connector assembly 12. To accomplish the bending, the mounting end 102 may be transitioned in a transitioning direction, shown in FIG. 6 by the arrow C. Optionally, the center contact 48 may be bent to approximately a ninety degree angle, as illustrated in FIG. 6, to define a right angle contact. The right angle contact positions the mating end centerline 101 and the mounting end centerline 103 approximately perpendicular to one another. In alternative configurations, the center contact 48 may be bent to transition angles 148 other than a ninety degree angle. The transition angle 148 may be obtuse or acute. Bending the center contact 48 in place is different than manufacturing the center contact 48 with the bent shape, such as manufacturing a right angle contact. By bending the center contact 48 in place, the tolerance to which the center contact 48 is made may be less stringent. For example, the angle and/or radius of curvature of the bend in the transition section 105 may not need to be controlled to tight tolerances. The angle and/or radius of curvature controls the vertical position of the mounting end 102, which can have a range of positions and still be coupled to the circuit board 20.

The rear dielectric portion 72 includes an anvil section 150. The anvil section 150 is defined by the corner or intersection of an inner surface 152 of the contact channel 84 and an inner surface 154 of the front wall 120 which forms the contact slot 130. The center contact 48 is bent about the anvil section 150 by transferring the mounting end 102 in the transitioning direction, shown in FIG. 6 by the arrow C. For example, the mounting end 102 is transferred from the contact channel 84 (shown by the dashed line in FIG. 6), through the contact slot 130, to the bent position. In the bent position, the center contact 48 is generally positioned proximate to the front wall 120. Optionally, the center contact 48 may engage at least a portion of the front wall 120. In operation, the clip 136 is utilized to hold the center contact 48 in the bent position. For example, the detent portions 138 may engage a rearward facing surface of the center contact 48. The clip 136 may receive the center contact 48 in a snap-fit manner wherein the detent portions 138 are at least partially compressed as the center contact 48 is forced through the opening separating the detent portions 138, and then the detent portions 138 rebound to substantially block removal of the center contact 48 from the clip 136.

A portion of the mating end 102 extends from the bottom of the rear dielectric portion 72 for coupling to the circuit board 20 (shown in FIG. 3). For example, the mounting end 102 may be mounted to the circuit board 20 by being received in a hole in the circuit board 20. Optionally, the tube walls 104 (shown in FIG. 4) may be squeezed together or otherwise compressed to fit within the hole. Such compression causes an outward force on the hole for a friction fit between the center contact 48 and the circuit board 20. Optionally, the center contact 48 may be soldered to the circuit board 20. Alternatively, the mounting end 102 may define a compliant pin that provides an electrical connection with the circuit board 20. In other alternative embodiments, the mating end 102 may be substantially flush with the base 126 for surface mounting to the circuit board 20.

In an exemplary embodiment, the rear dielectric portion 72 includes a positioning surface 160 extending into at least one of the contact channel 84 and the contact slot 130 from the side wall 118. The positioning surface 160 engages the center contact 48. The positioning surface 160 may control the relative position of the center contact 48 with respect to the rear dielectric portion 72. By controlling the position of the center contact 48, the bending of the transition section 105 may be controlled. By controlling the position of the center contact 48, the electrical performance of the connector assembly 12 (shown in FIG. 1) may be controlled, such as by controlling the spacing of the center contact 48 with respect to other components of the connector assembly 12, such as the outer contact 42 and/or the contact shell 40. For example, the impedance of the connector assembly 12 may be controlled by controlling the position of the center contact 48. By controlling the position of the center contact 48, the mating of the center contact 48 with the mating connector 14 (shown in FIG. 1) may be controlled, such as by properly aligning the center contact 48 to reduce stubbing and the like. The positioning surface 160 may be contoured to engage the center contact 48 when the center contact 48 is in the initially loaded position. The contoured surface may accommodate the center contact 48 as the center contact 48 is transitioned to the bent position. For example, the transition section 105 tends to flatten out proximate the anvil section 150 as the transition section 150 is bent on the anvil section 150.

Figure 7:
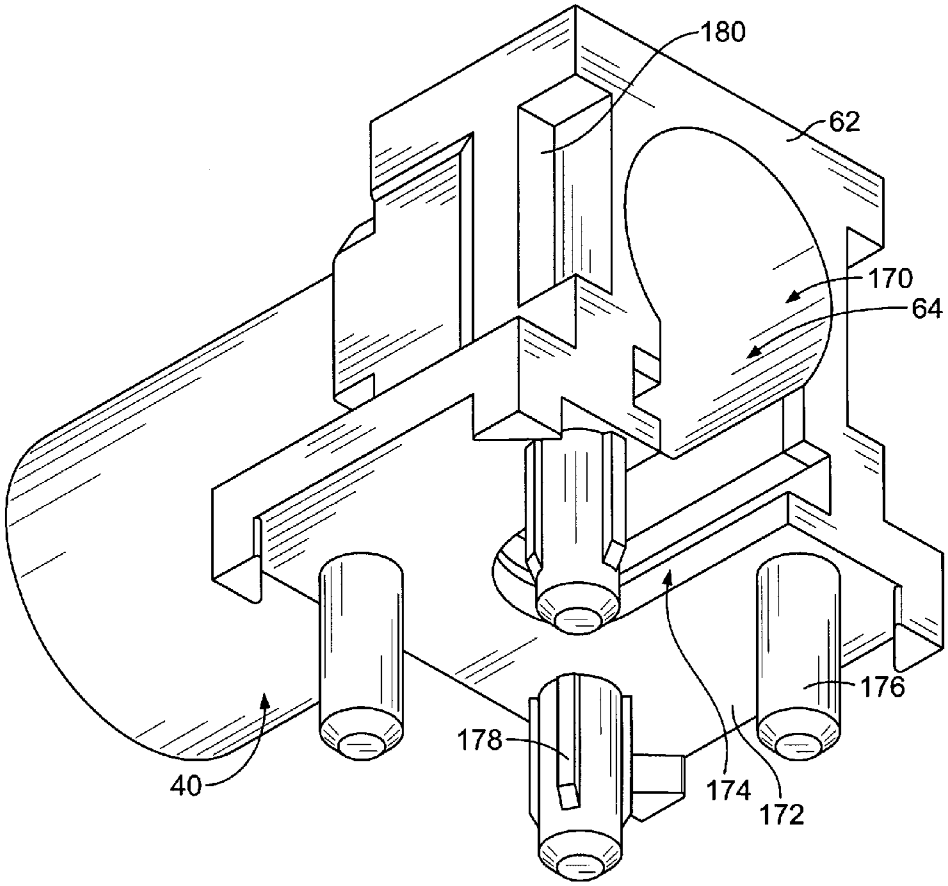
FIG. 7 is a rear perspective view of a shell of the connector assembly shown in FIG. 1.

FIG. 7 is a rear perspective view of the shell 40 of the connector assembly 12 (shown in FIG. 1). The shell rear end 62 includes an opening 170 that provides access to the shell cavity 64. The rear dielectric portion 72 (shown in FIGS. 3 and 4) is loaded into the shell cavity 64 through the opening 170. A bottom 172 of the shell 40 also includes an opening 174. The mounting end 102 (shown in FIGS. 4 and 6) may extend through the opening 174.

Mounting pins 176 extend from the bottom 172 for mounting to the circuit board 20 (shown in FIG. 2). The mounting pins 176 are received in holes in the circuit board 20. Optionally, at least some of the pins may include crush ribs 178 for stabilizing the shell 40. The mounting pins 176 and/or crush ribs 178 may have a friction fit with the holes in the circuit board 20.

The shell 40 includes catch surfaces 180 on opposed sides of the shell 40. The catch surfaces 180 are used to hold the outer housing 24 on the shell 40 after assembly. The catch surfaces 180 may be rear facing.

Figure 8:
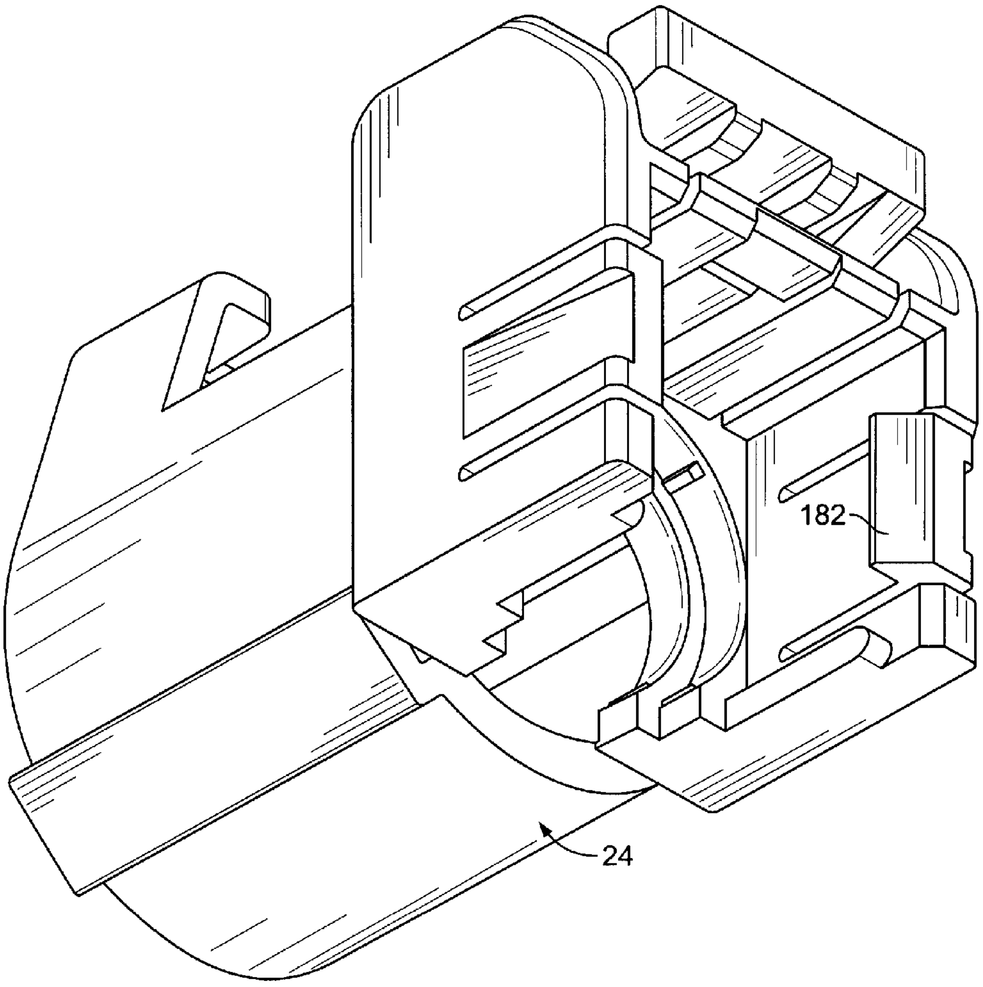
FIG. 8 is a rear perspective view of a housing of the connector assembly shown in FIG. 1.

FIG. 8 is a rear perspective view of the outer housing 24 of the connector assembly 12 (shown in FIG. 1). The outer housing 24 includes latch mechanisms 182 on the sides of the outer housing 24. The latch mechanisms 182 are configured to engage and catch on the catching surfaces 180 (shown in FIG. 7) of the shell 40 (shown in FIGS. 3, 4 and 6). The outer housing 24 is thus coupled to the shell 40.

A connector assembly 12 is thus provided that may be manufactured and/or assembled in a cost effective and reliable manner. Embodiments of the connector assembly 12 include a center contact 48 that may be stamped and formed from a blank of metal stock. During assembly, the center contact 24 is loaded into the front dielectric portion 70 and extends rearwardly therefrom. The rear dielectric portion 72 may be loaded onto the mounting end 102 of the center contact 48 to a fully loaded position. In the fully loaded position, the center contact 48, more particularly the bead 108, is captured between the front and rear dielectric portions 70, 72. During assembly, the center contact 48 is bent in place on an anvil section 150 of the rear dielectric portion 72 to a bent angle, which may be approximately ninety degrees, thus defining a right angle contact and a right angle connector. Once bent, the clip 136 of the rear dielectric portion 72 may be used to help retain the center contact 48 in the bent position. The mounting end 102 of the center contact 48 extends through the bottom of the rear dielectric portion 72 and the shell 40 for mounting to the circuit board 20. In an exemplary embodiment, the connector assembly 12 defines an RF antenna.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A connector assembly comprising:

a shell having a mating interface and a cavity;

a dielectric body having a front dielectric portion and a rear dielectric portion separately received in the cavity, the dielectric body having a contact channel extending from a front end of the dielectric body to a rear end of the dielectric body, the dielectric body having a contact slot open along a rear portion of the contact channel, the dielectric body having an anvil section defined at a forward intersection of the contact channel and the contact slot; and a contact received in the dielectric body, the contact having a mating end and a mounting end separated from one another by a transition section, the mounting end being received through the contact channel until the transition section is located proximate to the anvil section, the transition section being bent about the anvil section of the dielectric body to a transition angle such that the mounting end is oriented at a transverse angle to the mating end;

wherein the front dielectric portion is initially loaded into the cavity, the mating end of the contact is loaded into the front dielectric portion, and the rear dielectric portion is then loaded onto the mounting end of the contact to a final position.

2. The connector assembly of claim 1, wherein the contact is initially received in the dielectric body such that the mating end and the mounting end are generally parallel and aligned with one another.

3. The connector assembly of claim 1, wherein the contact is bent about the anvil section by moving the mounting end in a transitioning direction.

4. The connector assembly of claim 1, wherein the transition angle is approximately ninety degrees such that the contact defines a right angle contact.

5. The connector assembly of claim 1, wherein the dielectric body includes a detent portion extending into the slot, the detent portion holds the contact.

6. The connector assembly of claim 1, wherein the dielectric body includes a base, the slot is open at the base, the dielectric body forms a C-shaped clip proximate the base, the clip receives the contact in a snap-fit manner.

7. The connector assembly of claim 1, wherein the slot is defined by side walls and a front wall, the slot includes an open bottom, the channel extends along a top of the slot opposite to the bottom, the anvil section is defined at the intersection of the front wall and the channel, and wherein the contact extends parallel to the front wall.

8. The connector assembly of claim 1, wherein the dielectric body includes a positioning surface extending into at least one of the slot and the channel, the contact engages, and is positioned by, the positioning surface.

9. The connector assembly of claim 1, wherein the contact includes an outwardly extending bead, the bead being captured between the front dielectric portion and the rear dielectric portion.

10. The connector assembly of claim 1, wherein the transition section of the contact is bent about the anvil after the rear dielectric portion is in the final position.

11. A connector assembly comprising:

a circuit board defining an RF antenna;

a plug connector electrically and mechanically coupled to the circuit board, the plug connector being matable with a mating connector defining a FAKRA mating interface the plug connector comprising:

a shell having a mating interface and a cavity;

a dielectric outer housing surrounding the mating interface of the shell, the dielectric outer housing having at least one keying feature positioned radially outward from the shell and adapted for keyed mating with the mating connector;

a dielectric body received in the cavity, the dielectric body having an anvil section therein; and a contact received in the dielectric body, the contact having a mating end for mating with the mating connector and a mounting end coupled to the circuit board, wherein the contact is bent in place on the anvil section to form a right angle contact.

12. The connector assembly of claim 11, wherein the anvil section is defined by the intersection of two walls that are angled from one another by not more than 90°.

13. The connector assembly of claim 11, wherein the contact is generally straight when initially received in the dielectric body, and then the contact is bent about the anvil section such that the mounting end is oriented approximately perpendicular to the mating end.

14. The connector assembly of claim 11, wherein the dielectric body includes a front dielectric portion and a rear dielectric portion separately received in the cavity, and wherein the contact includes an outwardly extending bead, the bead being captured between the front dielectric portion and the rear dielectric portion.

15. A connector assembly comprising:

a shell having a mating interface and a cavity;

a dielectric body received in the cavity, the dielectric body having a contact channel extending from a front end of the dielectric body to a rear end of the dielectric body, the dielectric body includes a base generally opposite to the contact channel, the dielectric body having a contact slot defined by side walls extending between the contact channel and the base, the dielectric body having an anvil section defined at a forward intersection of the contact channel and the contact slot, the dielectric body includes a positioning surface extending from one of the side walls into the contact slot, and the dielectric body having a C-shaped clip within the slot; and a contact received in the dielectric body, the contact having a mating end and a mounting end, wherein the contact is bent about the anvil section of the dielectric body until the contact is received within the clip in a snap-fit manner, and wherein the contact engages the positioning surface as the contact is bent in place to control the relative position of the contact with respect to the side walls.

16. The connector assembly of claim 15, wherein the C-shaped clip is integrally formed with the dielectric body, the C-shaped clip surrounds more than half of the contact.

17. The connector assembly of claim 15, wherein the C-shaped clip includes a pair of detents extending into the slot from opposite side walls, a rear facing opening is defined between the detents, wherein the contact is loaded into the C-shaped clip through the opening and the detents engage a portion of the contact to hold the contact within the C-shaped clip.

18. The connector assembly of claim 15, wherein the positioning surface is non parallel to the side wall, the positioning surface having a thickness measured away from the side wall, the thickness of the positioning surface being relatively thinner closer to the anvil section and the thickness of the positioning surface being relatively thicker away from the anvil section.

19. The connector assembly of claim 15, wherein the positioning surface is contoured such that the positioning surface is non-planar, the positioning surface tending to flatten out toward the side wall proximate to the anvil section.

20. The connector assembly of claim 15, wherein the positioning surface is positioned between the contact and the shell, the positioning surface controlling the distance between the contact and the shell.

* * * * *